United States Patent [19]

Hamada

[11] 4,326,430

[45] Apr. 27, 1982

[54] INDICATION ELEMENT DRIVING DEVICE

[75] Inventor: Morio Hamada, Hino, Japan

[73] Assignee: Shinwa Audio Company, Ltd., Tokyo, Japan

[21] Appl. No.: 73,245

[22] Filed: Sep. 6, 1979

Related U.S. Application Data

[62] Division of Ser. No. 913,609, Jun. 7, 1978, abandoned.

[30] Foreign Application Priority Data

Jun. 10, 1977 [JP] Japan .................................. 52/69264
Jun. 21, 1977 [JP] Japan .................................. 52/72881

[51] Int. Cl.³ .......................... F16H 35/18; H03J 1/00
[52] U.S. Cl. .................................. 74/10.52; 74/10.7; 74/10.8; 74/572; 116/245; 116/262; 334/86
[58] Field of Search ............... 116/262, 261, 241, 245; 334/86; 310/74; 280/217; 318/161; 46/209; 74/10.8, 10 R, 572, 10.52, 10.7, 10.5, 10.54

[56] References Cited

U.S. PATENT DOCUMENTS

| | | | |
|---|---|---|---|
| 793,637 | 7/1905 | Clark | 46/209 |
| 931,743 | 8/1909 | Farrell | 318/161 |
| 1,343,697 | 6/1920 | Wahlert | 74/10.52 |
| 1,361,480 | 12/1920 | O'Connor | 74/10.54 X |
| 1,614,505 | 1/1927 | Trube | 74/10.54 |
| 1,931,624 | 10/1933 | Schwarze et al. | 74/10.8 |
| 2,030,129 | 2/1936 | Wheller | 74/10.8 |
| 2,205,103 | 6/1940 | Mahnken | 74/10.54 |
| 3,355,955 | 12/1967 | Aller | 74/10.52 |
| 3,422,687 | 1/1969 | Krepps, Jr. | 116/262 |
| 3,431,884 | 3/1969 | Marantz | 116/262 |
| 3,496,782 | 2/1970 | Carlson et al. | 74/10.8 |
| 3,955,429 | 5/1976 | Holden | 74/573 R |

FOREIGN PATENT DOCUMENTS

| | | | |
|---|---|---|---|
| 818556 | 9/1937 | France | 74/10.8 |
| 46-19802 | 6/1971 | Japan | 74/10.8 |
| 696189 | 8/1953 | United Kingdom | 46/209 |
| 965064 | 7/1964 | United Kingdom | 74/10.8 |

*Primary Examiner*—Leslie Braun
*Attorney, Agent, or Firm*—Michael N. Meller; Anthony H. Handal

[57] ABSTRACT

An indication element driving device is incorporated within a tuning apparatus. The driving device comprises a casing of a substantially cylindrical shape with both end faces covered, a driving shaft is rotatably supported passing through the covered end faces of the casing and is adapted to be selectively shifted in its axial direction to a first and second position, and briefly rotated upon a tuning operation. A flywheel disposed coaxially with the driving shaft inside the casing and supported rotatably with respect to said driving shaft. A pulley disposed coaxially with driving shaft at an extended part thereof extending and projecting outside the casing has fine cord wound therearound. A first clutch is operable when the driving shaft is set to the first position, a second clutch is operable when the driving shaft is set to the second position. A rotation transmission is adapted, when the first clutch is operating, to speed up the rotation of the driving shaft and to transmit the rotation thus speeded up to the flywheel, and after rotating manipulation to the driving shaft is released, to transmit the high-speed inertial rotation of the flywheel to the pulley. When the second clutch is in its operating state, rotation of the driving shaft causes speed reduction and transmission of rotation to the pulley.

5 Claims, 11 Drawing Figures

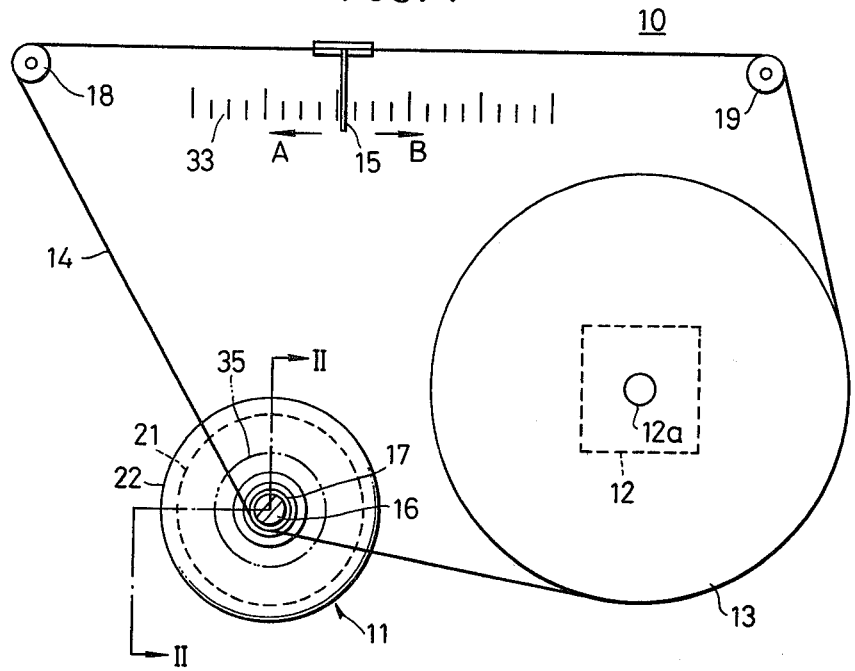
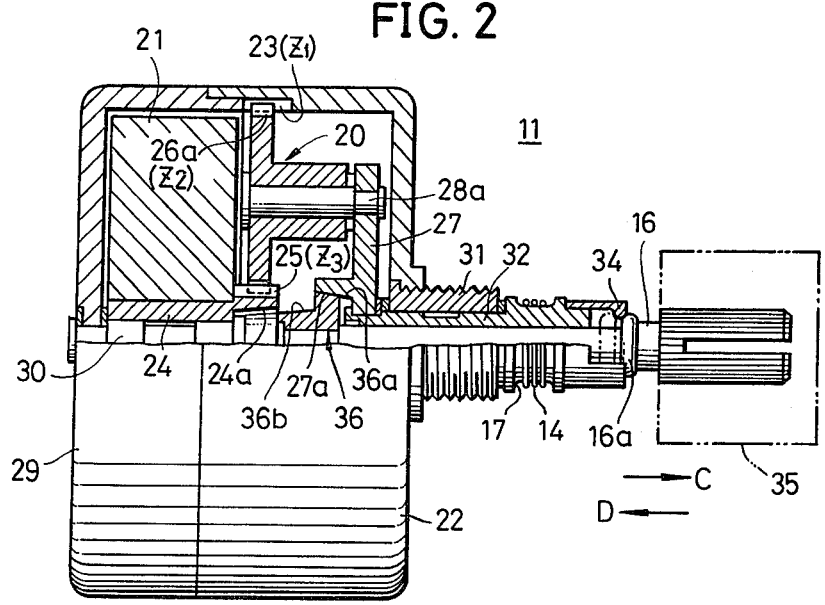

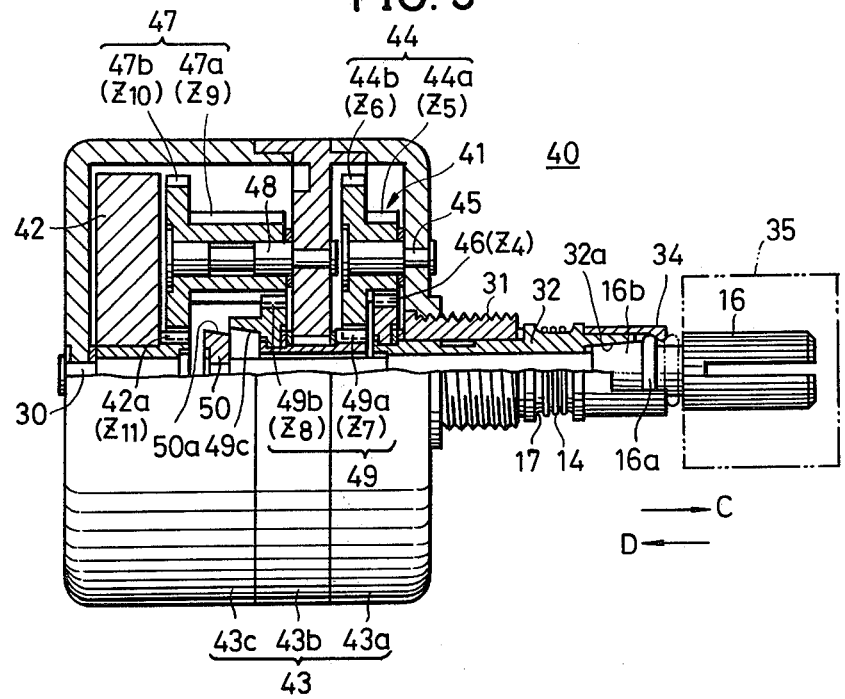
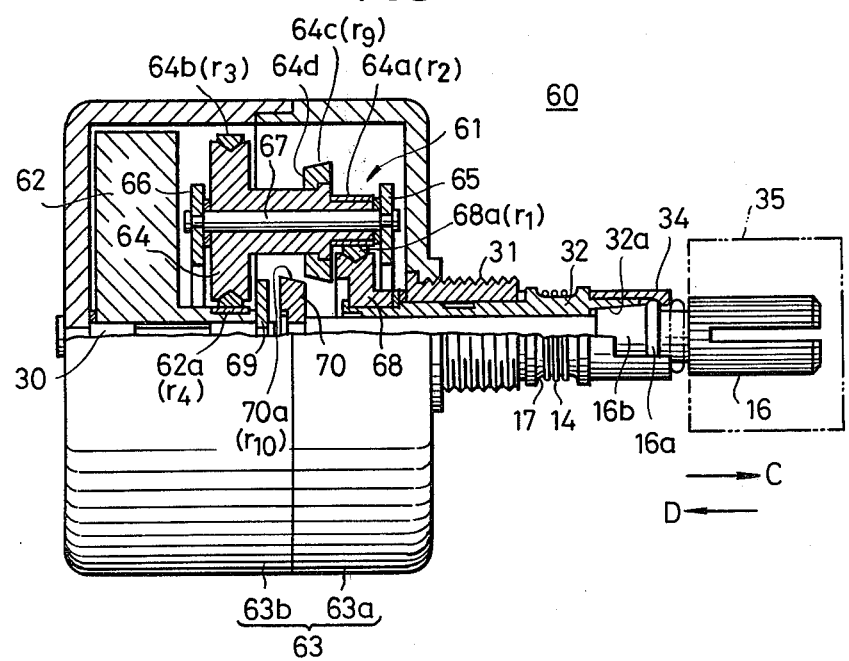

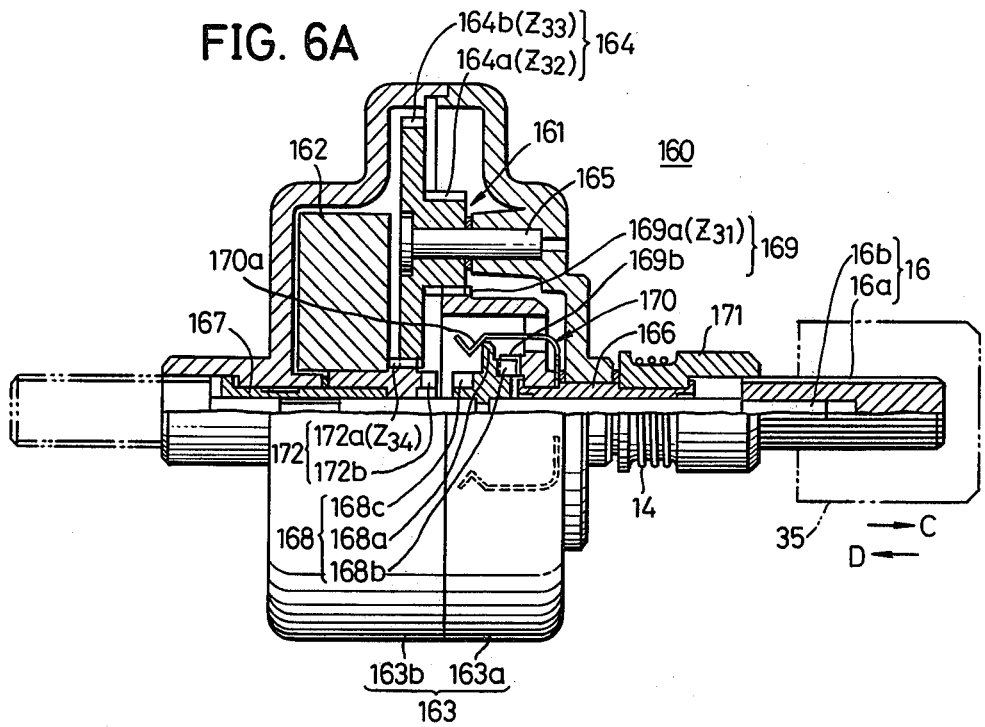
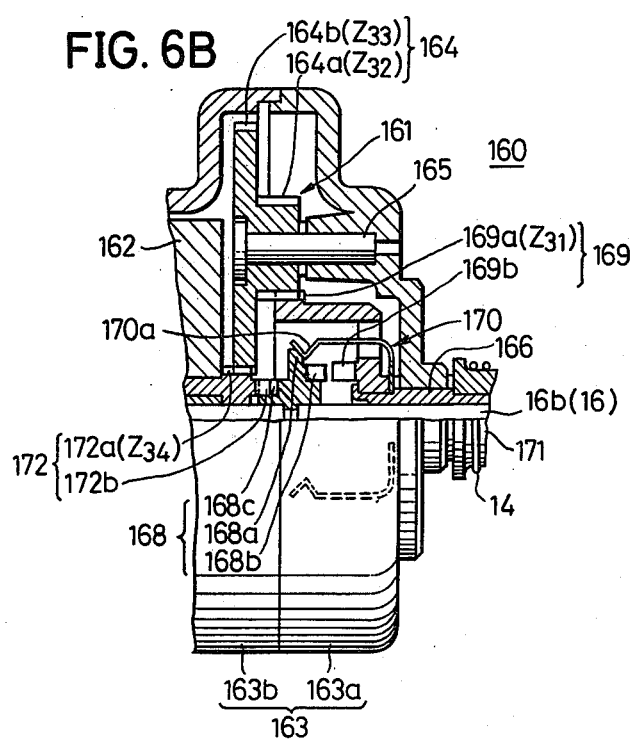

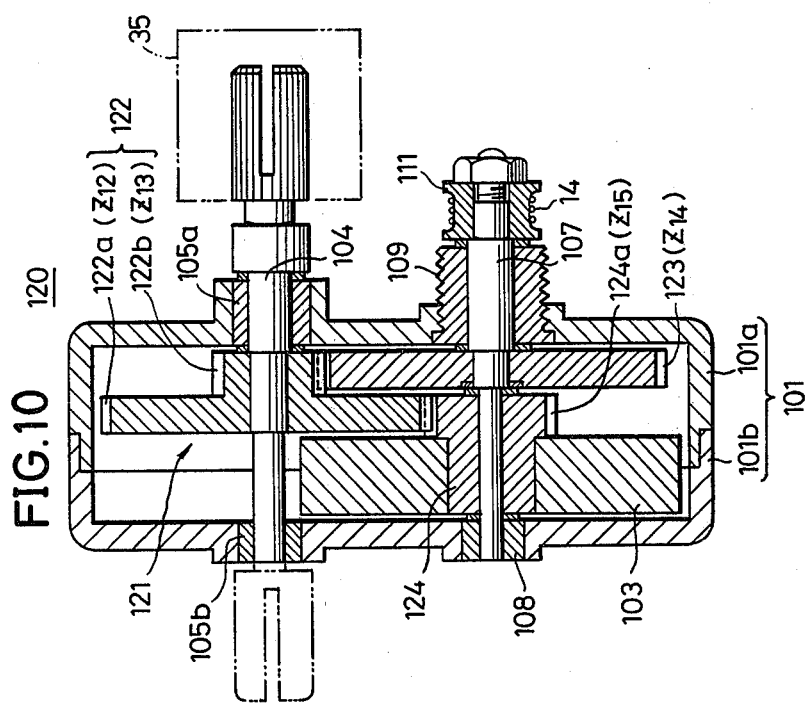
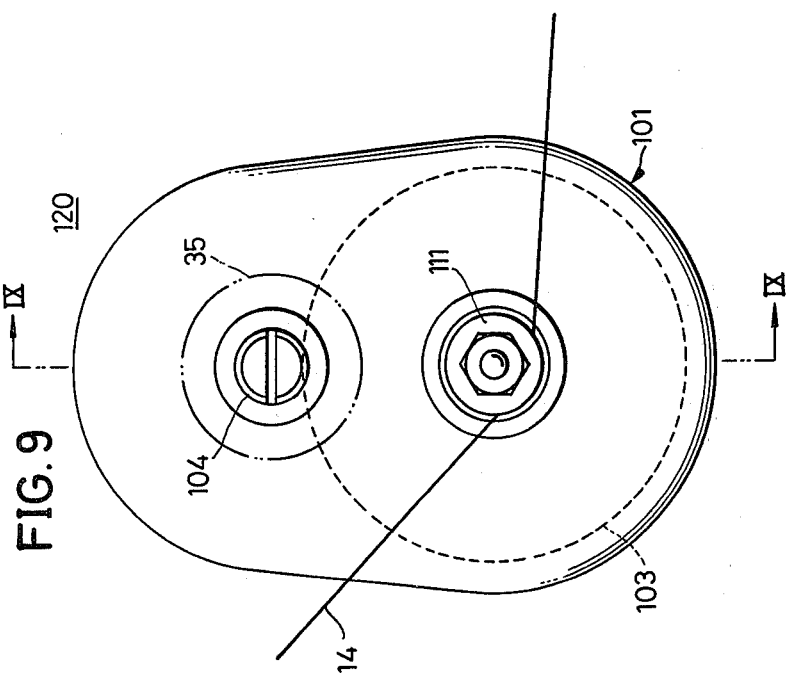

INDICATION ELEMENT DRIVING DEVICE

This is a division of application Ser. No. 913,609, filed June 7, 1978, now abandoned.

BACKGROUND OF THE INVENTION

This invention relates generally to an indication element driving device utilizing a mechanical flywheel effect, and more particularly to a device which is capable of carrying out, on one hand, a high-speed tuning operation through the positive use of a rotating inertial force of a flywheel which is rotated at a high speed with speeded up a rotation of a tuning control shaft and, on the other hand, a fine tuning operation by subjecting the rotation of said tuning control knob to speed reduction thereby to move an indicator pointer through a very small distance.

As an indication element driving device incorporated into a tuning apparatus in an audio instrument such as a radio receiver there has been known a device utilizing the rotating inertial force of a flywheel. In devices of this type, when the tuning shaft is given a sharp spin, the flywheel starts an inertial rotation. Due to the rotating inertial force of the flywheel, an indication needle or a pointer continues to shift, even after the tuning shaft is released, and moves smoothly across substantially the whole of the dial reading area. Accordingly, this device shows good-operability, particularly in the case where the indication pointer is moved rapidly over a relatively long distance.

The indication element driving device of this type known heretofore is of an arrangement in which a flywheel is directly secured to a tuning control shaft. In this arrangement, the flywheel is adapted to rotate unitarily with the tuning shaft and at the same speed as the tuning shaft, that is, at a relatively slow speed. For this reason, a flywheel of fairly large size is necessary in order to obtain a required inertial force. Accordingly, the above described device has been accompanied by difficulties such that the device becomes bulky and of large weight and therefore cannot be applied to the equipment required to be of small size and of lightweight. Moreover, the above described device is disadvantageous since a fine tuning operation is relatively difficult.

SUMMARY OF THE INVENTION

It is a general object of the present invention to provide a novel and useful indication element driving device in which the above described difficulties have been overcome.

A specific object of the present invention is to provide on indication element driving device wherein rotation is capable of carrying out a high-speed tuning operation in which a rotating inertial force of a flywheel is positively used, and a fine tuning operation in which the rotating inertial force of the flywheel is suppressed and the indication pointer is thereby moved through a very small distance.

Another object of the present invention is to provide an indication element driving device in which a high-speed tuning operation and a fine tuning operation can be carried out easily without any special changeover operation.

Other objects and further features of the invention will be apparent from the following detailed description when read in conjunction with the accompanying drawings.

BRIEF DESCRIPTION OF THE DRAWINGS

In the drawings:

FIG. 1 is a schematic elevation showing one example of a tuning apparatus having one embodiment of an indication element driving device according to the present invention;

FIG. 2 through FIG. 5 are side views, partly in vertical section, respectively showing first through fourth embodiments of an indication element driving device according to the present invention;

FIG. 6A is a side view, partly in vertical section, showing a fifth embodiment of an indication element driving device according to the present invention, in one mode thereof;

FIG. 6B is a partially sectional side view of an essential part of the indication element driving device shown in FIG. 6A, in another mode thereof;

FIG. 9 is an elevation showing a seventh embodiment of an indication element driving device, according to the present invention; and FIG. 10 is a side view, in vertical section, taken along the line X—X in FIG. 9, as viewed in the arrow direction.

DETAILED DESCRIPTION

Figure 5:
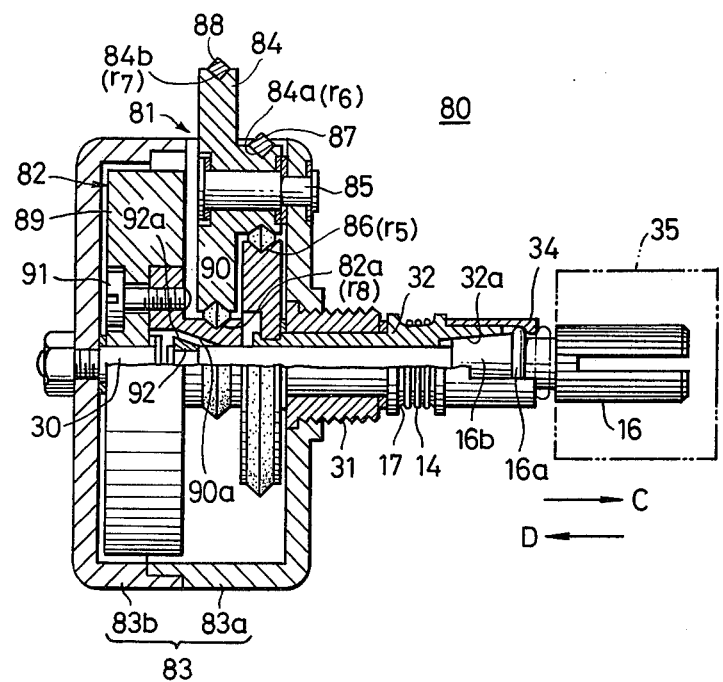

Referring first to FIG. 1, a tuning apparatus 10 comprises, essentially, an indication element driving device 11, a variable capacitor unit 12, a belt pulley 13 fixed to a rotary shaft 12a of the variable capacitor unit 12, and an indication pointer or needle 15 fixed to a fine cord 14. The fine cord 14 is of loop-form, and is wound two or three times around a pulley part 17 of a tuning control shaft 16, and guided by the belt pulley 13, and further stretched between a pair of small belt pulleys 18 and 19 which are respectively disposed at opposite ends of a dial reading area 33.

The indication element driving device 11 is of an arrangement, as indicated in FIG. 2, wherein, for high-speed tuning, a rotation of a tuning control shaft (a driving shaft) 16 is speeded up through a planetary gear mechanism 20 and is then transmitted to a flywheel 21, and for fine tuning, the tuning control shaft 16 directly rotates the flywheel 21, the rotation thereof is subjected to speed reduction through the planetary gear mechanism and is then transmitted to the pulley part. The changeover back and forth between the high-speed tuning operation and the fine tuning operation is carried out by shifting the tuning control knob 16 in the axial direction thereof to change over its position.

In FIGS. 2 through 5, the shaft changeover positions are indicated, only at the right side of the tuning control shaft, by a two-dot chain line, and the indication at the left side of the tuning control shaft is omitted. The planetary gear mechanism 20 comprises an internal gear 23 (number of teeth: Z1) cut around the internal peripheral surface of a front-side casing 22, a sun gear 25 (number of teeth: Z3) cut around a sleeve 24 fixed to the flywheel 21, and a pair of planet gears 26a and 26b (number of teeth: Z2) which are meshed with both the internal gear 23 and the sun gear 25. Among the planet gears 26a and 26b, indication of one planet gears 26b is omitted. This pair of plane gears 26a and 26b are rotatably supported on pins 28a and 28b (indication of the pin 28b being omitted), respectively, embeddedly fixed to an arm 27 which is secured to the tuning control shaft 16, and are disposed at positions diametrically opposite each other.

The flywheel 21 is of small size (for example, thickness: 7.5 mm, diameter: 33φ, weight: 30 gr, inertial moment: 2.7 kg-mm²) and is rotatably supported, together with a sleeve 24, on a stationary shaft 30 which is fixed to a rear-side casing 29, and is provided as a member independent of the control shaft 16. This flywheel 21 may be of small size, due to reasons described hereinafter, and accordingly, the device 11 may be of compact and light-weight structure overall. Furthermore, since the stationary shaft 30 is disposed coaxially with the tuning control shaft 16, that is, the flywheel 21 coaxially with the shaft 16, the indication element driving device 11 may be of compact structure, without any wasted space. A sleeve 31 is mounted to the front-side casing 22. The device 11 is screw fastened to a chassis of an apparatus, with the aid of a screw formed on the sleeve 29. Another sleeve 32 is rotatably supported inside the sleeve 31. The above described pulley part 17 is formed on the sleeve 32 at its right hand side. The arm 27 and a leaf spring 34 are respectively secured to the sleeve 32 at the right and left ends thereof.

The tuning control shaft 16 is supported, rotatably and slidably in its axial direction, inside the sleeve 32. An annular projection 16a is formed on the shaft 16 near the right end thereof. A control knob 35 is mounted to the shaft 16 at the right end thereof. The tuning control shaft 16 is set, together with the control knob 35, at a position moved in the direction indicated by arrow C and indicated by a solid line, and at another position moved in the reverse direction indicated by arrow D and indicated by two-dot chain line, with the cooperative action of an annular projection 16a and the leaf spring 34.

Moreover, the arm 27 and the sleeve 24 are respectively formed, at their end lateral faces, with recessed taper surfaces 27a and 24a. A taper member 36 having taper surfaces 36a and 36b is secured to the distal end of the tuning control shaft 16.

Moreover, the indication element driving device 11 is of unit-form structure in which the planetary gear mechanism 20 and the flywheel 21 are accommodated within the casings 22 and 29. Here, since the internal gear 23 is cut and formed directly around the internal peripheral surface of the frontside casing 22, the device 11 may be of miniature structure compared with structure in which the internal gear 23 is separately provided in addition to the casing.

Next, the operation of the device of the above described structure will be described.

Upon a high-speed tuning operation, the knob 35 and the shaft 16 are pulled and set at the position indicated by solid line in FIG. 2. This causes the taper surface 36a of the taper member 36 to make frictional engagement with the recessed taper surface 27a. When the knob 35 is turned, in this state, for instance, in the clockwise direction in FIG. 1, the arm 27 rotates unitarily with the shaft 16, and the pair of planetary gears 26a and 26b rotate in the same direction as the shaft 16 around the internal gear 23. Since the casing 22 is stationary, the planet gears 26a and 26b respectively rotate about the pins 28a and 28b in a counterclockwise direction, as viewed from the front side of the device 11. The rotation of the planet gears 26a and 26b about the pins 28a and 28b cause the sun gear 25 to rotate clockwise at high speed, together with the flywheel 21.

Upon a tuning operation, when the tuning control shaft 16 is manipulated to turn one revolution, for instance, together with the arm 27, the internal gear 23, that is, the casing 22 does not rotate, but the sun gear 25, that is, the flywheel 21 turns (Z3+Z2)/Z3 revolutions. That is, the flywheel 21 is speeded up (Z3+Z2)/Z3 times (about six to twelve times, in practical application) as much as the rotation of the tuning control shaft 16, and is thus rotated.

In general, the kinetic energy W of a rotating body is expressed by a following equation:

$$W = \tfrac{1}{2} I \omega^2 \qquad (1)$$

where:

I; inertial moment of the rotating body about axis, and
ω; angular velocity of the rotating body.

In the case where the rotating body is a disc, the kinetic energy W of the disc is expressed as follows.

$$W = \tfrac{1}{2} \times mr^2/2 \times \omega^2 = \tfrac{1}{4} mr^2 \omega^2 \qquad (2)$$

where:

m; weight of disc, and
r; radius of disc.

This equation (2) is rearranged and expressed as follows.

$$W = \tfrac{1}{4} S T \pi r^4 \omega^2 \qquad (3)$$

where:

S; specific weight of the disc, and
T; thickness of the disc.

From Eq. (3), it is understood that, even if the disc is miniaturized or of light-weight, with its thickness reduced to one-quarter, and its radius to one-half, for example, this disc is capable of generating a kinetic energy which is substantially the same as that generated by the original disc, by increasing its angular velocity eight times. Noting this, the present invention is of a structure wherein a speed-up mechanism is provided, and a miniature and light-weight flywheel is used as the flywheel 21. Accordingly, the device 11 is of a structure which is miniaturized and of light-weight in comparison with the device known hitherto, and moreover, exhibits similar functions to the conventional device, in performance.

Upon carrying out a so-called high-speed tuning operation with the indication element driving device 11, the shaft 16 is pulled and set at the above described position and then the knob 35 is operated with great force to rotate in a predetermined direction, and then immediately set free. This operation causes that the rotation of the tuning control shaft 16 is speeded up by six to twelve times in the planetary gear mechanism 20 and then transmitted to the flywheel 21, which thereby rotates at high speed. The flywheel 21 thus imparted with inertial force continues inertial rotation at high speed, after manipulation to the knob 35 is released.

The high-speed inertial rotation of the flywheel 21 is now conversely subjected to speed reduction in the planetary gear mechanism 20 by $$\left(\frac{Z3}{Z3+Z2}\right)$$

times and then transmitted to the sleeve 32. Accordingly, the sleeves 32 continues to rotate, together with the pulley part 17, in the rotational manipulation direction, even after the above manipulation is released. The fine cord 14 is wound on the pulley part 17 rotating and being run guided by the belt pulleys 13, 18, and 19, in FIG. 1. As a result of this, the variable capacitor unit 12 operates, and the indication pointer 15 is driven to move in the direction indicated by arrows A or B up to termination of the dial reading area 33 through a relatively long distance, under the inertial action. Thus, the high-speed tuning operation is carried out.

Whereupon the variable capacitor 12 and the indication pointer 15 respectively operate or travel to their terminal point due to the inertial operation, slip occurs thereafter between the pulley part 17 and the fine cord 14, whereby there arise no problems such that the variable capacitor unit 12 is rotated excessively.

On the other hand, upon a fine tuning operation, the knob 35 is pushed down and the shaft 16 is set at the position indicated by the two-dot chain line in FIG. 2. As a result, interconnection between the taper surfaces 36a and 27a are released, and simultaneously, the taper surface 36b of the taper member 36 makes frictional engagement with the taper surface 24a of the sleeve 24. The tuning control shaft 36 is thus directly connected to the flywheel 21. Since the flywheel 21 is of small size and lightweight, the control knob 35 is rotated lightly and finely, accompanied by little or no influence of inertial force from the flywheel 21.

The rotation of the knob 35 is subjected to speed reduction in the planetary gear mechanism 20 and is then transmitted to the sleeve 32, which thereby rotates unitarily with the pulley part 17 at an extremely slow speed. The rotation of the pulley part 17 causes the indication pointer 15 to move finely by way of the thin cord 14 and to operate the variable capacitor unit 12 slightly, whereby the fine tuning operation is carried out.

Next a description will be given of the other embodiments of the indication element driving device, according to the present invention. Each device embodying the present invention may be applied to the tuning apparatus indicated in FIG. 1. In each embodiment, parts which are substantially the same as corresponding parts in FIG. 2 are designated by like reference numerals, and detailed description of such parts will be omitted. Moreover, in first through fourth embodiments, the flywheel is provided coaxially with the control shaft, in order that miniaturization is achieved effectively.

FIG. 3 shows a second embodiment of the indication element driving device according to the present invention. This indication element driving device 40 is so arranged that, when the tuning control shaft 16 is rotated, a miniature flywheel 42 is rotated at high speed by way of a gear mechanism 41, and the requisite rotating inertial force of the flywheel 42 thus imparted thereto causes the indication pointer 15 to undergo inertial travel. The gear mechanism 41 and the flywheel 42 are accommodated within a casing 43 of small size consisting of three casing members 43a, 43b, and 43c.

A first stepped gear 44 is pivoted about a pin 45 fixed to the front casing member 43a, and has a gear part 44a (number of teeth: Z5) and another gear part 44b (number of teeth: Z6). The gear part 44a is in mesh with a gear 46 (number of teeth: Z4) which is secured to the control shaft 16.

A second stepped gear 47 is pivoted about a pin 48 fixed to the center casing member 43b, and has a gear part 47a (number of teeth: Z9) and another gear part 47b (number of teeth: Z10). The gear part 47b is in mesh with a gear 42a (number of teeth: Z11) which is secured to the flywheel 42 and is pivoted on the stationary shaft 30.

A gear sleeve 49 is rotatably supported on the control shaft 16 and is adapted to rotate independently of the shaft 16 and the center casing member 43b. The gear sleeve 49 has cut and formed at its opposite ends a gear part 49a (number of teeth: Z7) and another gear part 49b (number of teeth: Z8), which are respectively in mesh with the gear parts 44b and 47a.

The tuning control shaft 16 is formed at a part near its proximal part with a taper surface 16b, and is provided, at its free end, with a taper member 50 having a taper surface 50a. A taper surface 32a is formed at one end of the sleeve 32, around the inside thereof, and a gear 46 is secured to the other end of the sleeve 32. Further, a taper surface 49c is formed around a recessed part at one end of the gear sleeve 49.

In this device, the gear mechanism 41 has a speed-up ratio which is larger than that in the first embodiment, and accordingly, a flywheel 42 with a smaller thickness may be employed.

Upon high-speed tuning, the knob 35 and the shaft 16 are depressed in the direction indicated by arrow D and are set at a position indicated by a solid line in FIG. 3, whereby the taper surface 16b makes frictional connection with the taper surface 32a.

When the knob 35 is given a sharp turn, the sleeve 32 rotates unitarily with the shaft 16. The rotation of the sleeve 32 is speeded up by $Z4/Z5 \times Z6/Z7 \times Z8/Z9 \times Z10/Z11$ times in the gear mechanism 41 and is then transmitted to the flywheel 42, which thus rotates at high speed. Accordingly, the flywheel 42 of small size and light-weight now generates a requisite rotating inertial force.

The rotating inertial force of the flywheel 42 causes the sleeve 32 (pulley part 17) to rotate by way of the gear mechanism 41, whereby the fine cord 14 travels and the indication pointer 15 is driven to move in the directions indicated by the arrow A or B to the termination of the dial reading area 33, under the inertial action.

On the other hand, the fine tuning is carried out by pulling the knob 35 and the shaft 16 in the direction indicated by arrow C to set it at a position indicated by two-dot chain line, and then turning the knob 35 slowly. When the knob 35 is shifted in the direction indicated by arrow C, interconnection between the taper surfaces 16b and 32a is released, and the taper surface 50a of the taper member 50 comes into frictional engagement with the taper surface 49c of the gear sleeve 49.

As a result of this, the gear mechanism 41 is changed over, and the speed-up ratio of the flywheel 42 with respect to the control shaft 16 becomes small. Accordingly, the tuning knob 35 is manipulated to turn the counter with a small load, accompanied by little influence of the rotating inertial force of the miniature and light-weight flywheel 42.

The rotation of the knob 35 is subjected to speed reduction by way of the shaft 16, the gear sleeve 49, and the gear 46, and is transmitted to the sleeve 32, whereby fine tuning is carried out.

FIG. 4 shows a third embodiment of the indication element driving device according to the present invention. This indication element driving device 60 is so arranged that, when the tuning control shaft 16 is rotated, a miniature flywheel 62 is rotated at high speed by shaft 16 by way of a fricion wheel mechanism 61, and the rotating inertial force of the flywheel 62 thus imparted thereto causes the indication pointer 15 to travel. The friction wheel mechanism 61 and the flywheel 62 are accommodated within a casing 63 of small size consisting of a pair of casing members 63a and 63b. Ring members made of neoprene are fitted to the frictional transmitting parts of the friction wheel mechanism 51.

A stepped friction wheel 64 is rotatably supported on a shaft 67 supported between a pair of arms 65 and 66 mounted to the casing 63. This stepped fricion wheel 64 is being urged to undergo displacement toward the control shaft 16, by means of the springs (not shown) by ay of the pair of arms 65 and 66.

Accordingly, a friction sleeve 64a (radius: r2) fitted on the friction wheel 64 is pressed against a friction ring 68a (radius: r1) fitted on a friction wheel 68 which is secured to the tuning control shaft 16. Another friction ring 64b (radius: r3) fitted on the friction wheel 64 is pressed against a friction sleeve 62a (radius: r4) fitted on a small radial part of the flywheel 62.

The flywheel 62 is pivoted on the stationary shaft 36 which is supported or held at opposite ends by the casing member 63b and a supporting member 69 respectively.

The friction wheel 64 is further provided at its intermediate part with a friction ring 64d, which peripheral surface is of taper surface 64c (radius: r9). A taper member 70 is secured to the tuning control shaft 16, at its free end, and the peripheral surface of the taper member 70 is of taper surface 70a (radius: r10). The friction wheel 68 is secured to the sleeve 32.

Upon high-speed tuning, the knob 35 is depressed in the direction indicated by arrow D and the shaft 16 is set at a position indicated by a solid line in FIG. 4 thereby to assume frictional connection between the taper surfaces 16b and 32a.

Thereafter, when the knob 35 is given a sharp turn, the sleeve 32 rotates unitarily with the shank 16.

The rotation of the sleeve 32 is speeded up by r1/r2×r3/r4 times in the friction wheel mechanism 61 and is then transmitted to the flywheel 62, which thus rotates at high speed. Thus, the flywheel 62 of small size and light-weight now generates a requisite rotating inertial force.

The rotating inertial force of the flywheel 62 causes the tuning control shaft 16 to rotate together with the pulley part 17, and the indication pointer 15 is driven to move or shift in the direction indicated by arrows A or B, similar to the preceding case.

On the other hand, the fine tuning is carried out by pulling the knob 35 in the direction indicated by arrow C thereby to release interconnection between the taper surfaces 16b and 32a and to make the taper surface 70a assume frictional connection with the taper surface 64c, and then by turning the knob 35 slowly. The flywheel 62 is now speeded up by r10/r9×r3/r4 times and is rotated. However, since the speed-up ratio is small, the tuning knob 35 is finely rotated, accompanied by a relatively small load.

The rotation of the knob 16 is subjected to speed reduction by way of the friction sleeve 64a and the friction ring 68a, and the pulley 17 rotates at extremely slow speed, whereby fine tuning is carried out.

FIG. 5 shows a fourth embodiment of the indication element driving device according to the present invention. This indication element driving device 80 is so arranged that a miniature flywheel 82 is rotated at high speed by way of a belt pulley mechanism 81, when the tuning control shaft 16 is rotated, and the rotating inertial force of the flywheel 82 thus imparted thereto causes the indication pointer 15 to undergo inertial travel. The belt pulley mechanism 81 and the flywheel 82 are accommodated within a miniature casing 83 consisting of a pair of casing members 83a and 83b.

A stepped belt pulley 84 comprises a small-radius pulley 84a (radius: r6) and a large-radius pulley 84b (radius: r7), and is pivoted on a shaft 85 mounted to the casing member 83a. A belt 87 is stretched between the small-radius pulley part 84a and a belt pulley 86 (radius: r5) secured to the tuning control shaft 16. Another belt 88 is stretched between the large-radius pulley part 84b and a pulley part 82a (radius: r8) formed integrally with the miniature flywheel 82.

In this indication element driving device 80, the flywheel 82 comprises a flywheel structure 89 and a belt pulley 90 screw fastened to each other. The belt pulley 90 has formed therein a pulley part 82a and a taper surface 90a. A taper member 92 having a taper surface 92a formed thereon is secured to the far end of the control shaft 16.

Upon high-speed tuning, the knob 35 is depressed in the direction indicated by arrow D to set the shaft 16 at a position indicated by solid line in FIG. 5 and to make the taper surface 16b assume frictional interconnection with the taper surface 32a.

Then, when the knob 35 is given a sharp turn, the sleeve 32 rotates unitarily with the shaft 16. The rotation of the sleeve 32 is speeded up by r5/r6×r7/r8 times in the belt pulley mechanism 81 and is then transmitted to the flywheel 82, which thus rotates at high speed. Thus, the miniature and light-weight flywheel 82 now generates a requisite rotating inertial force.

This rotating inertial force of the flywheel 82 causes the sleeve 32 (pulley part 17) to rotate by way of the belt pulley mechanism 81, and the indication pointer 15 is driven to shift in the lateral direction, under the inertial force.

On the other hand, fine tuning is carried out firstly by pulling the shaft 16 in the direction indicated by arrow C thereby to release interconnection between the taper surfaces 16b and 32a and to make the taper surface 92a of the taper member 92 assume frictional connection with the taper surface 90a, and then by turning the knob 35 slowly.

As a result of the above described pulling operation, the control shaft 16 is directly interconnected with the miniature flywheel 82. Accordingly, the tuning knob 35 is rotated counter to the extremely light load, accompanied by little influence of the inertial force of the flywheel 82.

The rotation of the knob 35 is subjected to speed reduction to large extent in the belt pulley mechanism 81 and is transmitted to the sleeve 32, and the indication pointer 15 and the variable capacitor unit 12 operates finely, whereby the fine tuning operation is carried out.

The devices 60 and 80 indicated in FIG. 4 and FIG. 5 can be produced at low cost, since the speed-up mechanism incorporated therein does not include gears but pulleys.

FIGS. 6A and 6B respectively show a fifth embodiment of the indication element driving device according to the present invention. This indication element driving device 160 is so arranged that a miniature flywheel 162 is rotated at high speed by way of a gear mechanism 161, when the tuning control shaft 16 which is of a unitary structure of shaft parts 16a and 16b is rotated, and the rotating inertial force of the flywheel 162 thus imparted thereto causes the indication pointer 15 to undergo inertial travel. The gear mechanism 161 and the flywheel 162 are accommodated within a miniature casing 163 consisting of a pair of casing members 163a and 163b.

A stepped gear 164 comprises a gear part 164a (number of teeth: Z32) and another gear part 164b (number of teeth: Z33), and is pivoted on a shaft 165 mounted to the casing member 163a.

The shaft part 16b of the tuning control shaft 16 is supported inside sleeves 166 and 167 rotatably and slidable in its axial direction over a predetermined distance. The sleeves 166 and 167 are respectively journaled in the casing members 163a and 163b.

A movable clutch member 168 is secured to the free end of the shaft part 16b. The clutch member 168 has a disc-formed projection 168a formed at an intermediate part thereof, and clutch claws 168b and 168c formed at opposite lateral sides thereof.

The sleeve 166 is fixed with a gear 169, a leaf spring 170 having four arm-shaped resilient lugs 170a, and a pulley 171. The gear 169 of cylindrical shape closed at the bottom has a gear part (number of teeth: Z31) cut around the outer periphery to mesh with the gear part 164a of the stepped gear 164, and clutch claws 169b cut annularly inside the bottom thereof. Each arm-shaped resilient bent part 170a passes through opening 169c in the bottom and is projected into the cylinder part of the gear part 169a.

A gear 172 which is fabricated unitarily with the fly-wheel 162 comprises a gear part 172a (number of teeth: Z34) which is in mesh with the gear part 164b of the stepped gear 164, and clutch claws 172b formed annularly on the right end surface thereof.

Upon high-speed tuning, the shaft 16 is pulled in the direction indicated by arrow C to set it at the position shown in FIG. 6A. This causes that the claws 168b of the clutch member 168 comes into mesh with the claws 169b of the gear 169, and the projection 168a is engaged with the right-side parts of each lug 170a whereby the clutch member 168 is resiliently set in its axial direction.

When the control knob 32 is given a sharp turn under the condition set forth above, the gear 169 rotates unitarily with the control shaft 16 via the clutch member 168. The rotation of the gear is speeded up by $Z31/Z32 \times Z33/Z34$ times in the gear mechanism 161 and is then transmitted to the flywheel 162. Thus, the flywheel 162 rotates at high speeds about the shaft part 16b, and generates a requisite rotating inertial force. The high-speed inertial rotation of the flywheel 162 causes the sleeve 166 and the pulley 171 to continue rotation, whereby the indication pointer 15 is shifted in the lateral direction.

While, upon fine tuning, the knob 35 is depressed to slide the shaft 16 in the direction indicated by arrow D in FIG. 6A. Together with the shaft 16, the clutch member 168 also moves in the same direction, which brings into that, on one hand, the meshing engagement between the clutch claws 168b and 169b is released, and on the other hand, the clutch claws 168c come into meshed with the clutch claws 172b of the gear 172. As the clutch member 168 moves, the disc-formed projection 168a pushes the resilient lugs 170 (which undergo resilient deformation in the outer peripheral direction) aside and rides thereover. The resilient lugs 170 then make restoring deformation and the left-side parts thereof come into resilient engagement with the projection 168a, whereby the clutch member 168 is set in its position in the axial direction thereof.

In this state, when the control knob 32 is turned slowly, the flywheel 162 rotates unitarily therewith by way of the clutch mechanism wherein the clutch claws 168c and 172b have been meshed each other. Accordingly, the control knob 32 is rotated with extremely light force accompanied by little or no influence of the inertial force of the flywheel 162.

The rotation of the knob 32 is subjected to speed reduction largely in the gear mechanism 161 and is then transmitted to the sleeve 166 and the pulley 171. Accordingly, the indication pointer 15 and the variable capacitor unit 12 respectively move and operate slightly, whereby the fine tuning operation is carried out.

Next description is given on the tenth sixth and seventh embodiments of the indication element driving device according to the present invention, with further reference to FIG. 7 through FIG. 10. These embodiments are of arrangement wherein high-speed tuning and fine tuning can be carried out without any particular changeover operation.

Figure 8:
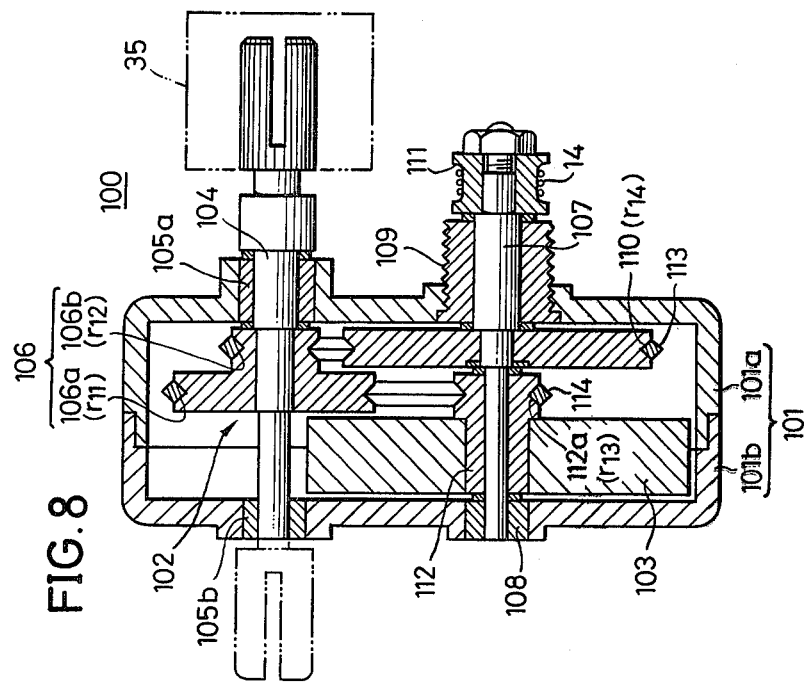
FIG. 8 is a side view, in vertical section, taken along the line VIII—VIII in FIG. 7, as viewed in the arrow direction.
Figure 7:
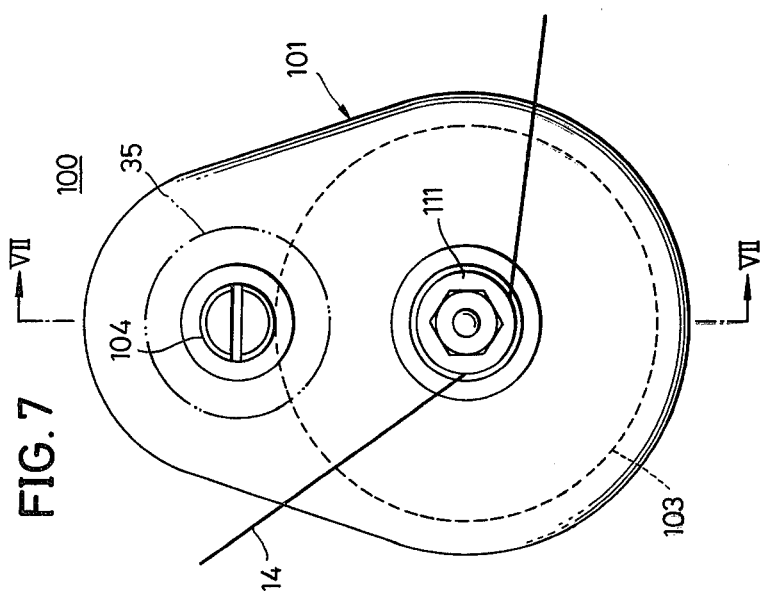
FIG. 7 is an elevation showing a sixth embodiment of an indication element driving device according to the present invention.

FIG. 7 and FIG. 8 respectively show a tenth embodiment of the indication element driving device according to the present invention. In a device 100, a belt pulley mechanism 102 and a miniature and light-weight flywheel 103 are accommodated within a casing 101 consisting of a pair of casing members 101a and 101b.

A tuning control shaft 124 is rotatably supported, at a position above the center, by a pair of bearings 105a and 105b. A stepped belt pulley 105 having a pulley parts 105a (radius: r11) and 106b (radius: r12) is secured to the shaft 104. A rotary shaft 107 is rotatably supported, at a position below the center, by a bearing 108 and a sleeve 109 having a threaded part cut around the external periphery thereof. A belt pulley 110 (radius: r14) and a pulley 111 are secured to the shaft 107. The thin cord 14 is wound several times around the pulley 111. A bearing sleeve 112 to which the flywheel 103 is secured and which has formed at its one end side with a pulley part 112a (radius: r13) is rotatably supported on the rotary shaft 107. A belt 113 is stretched between the pulley part 106b and the belt pulley 110, and another belt 114 between the pulley parts 106a and 112a.

The weight of the flywheel 103 and the speed-up ratio r13/r11 are so determined that a required rotating inertial force is imparted to the flywheel 103 when the tuning knob 35 is given a sharp spin in order to carry out a high-speed tuning operation, and no difficulty arises in a fine tuning operation.

For high-speed tuning operation, the tuning knob 35 is given a sharp spin. The rotation of the shaft 104 is overdriven r13/r11 times by way of the pulley part 106a the belt 114, and the pulley part 112a, and the flywheel 103 rotates at high speed, whereby a requisite rotating inertial force is imparted to the flywheel 103. Thereafter, the high speed inertial rotation of the flywheel 103 is subjected to speed reduction by $r13/r11 \times r12/r14$ times by means of the belt pulley mechanism 102 and is transmitted to the shaft 107, whereby the pulley 111 continues to rotate at a speed lower than that of the control shaft 104. The rotation of the pulley 111 causes the indication pointer 15 to move to the termination of the dial reading area 33 by way of the fine cord 14, as indicated in FIG. 1.

The fine tuning operation is carried out by rotating the tuning knob 35 slowly. This manipulation causes the flywheel 103 to rotate, but the rotating inertial force imparted thereto is on the order of a value which does not adversely affect the fine tuning operation. Moreover, the rotation of the knob 35 is subject to speed reduction by r12/r14 times by way of the pulley part 106b, the belt 113, and the belt pulley 110, and the pulley 110 thus rotates at extremely slow speed, and whereby the indication pointer 15 similarly moves at extremely slow speed.

FIG. 9 and FIG. 10 respectively show a seventh embodiment of the indication element driving device according to the present invention. Parts, in FIG. 9 and FIG. 10, which are substantially the same as corresponding parts in FIGS. 7 and 8 are designated by like reference numerals, and detailed description of such parts will not be repeated.

A device 120 essentially comprises a gear mechanism 121, instead of the belt pulley mechanism 102 provided in the device 100 indicated in FIG. 8. A stepped gear 122 has a large-diameter gear part 122a (number of teeth: Z12) and a small-diameter gear part 122b (number of teeth: Z13), and is secured to the tuning control shaft 104. A gear 123 (number of teeth: Z14) is secured to the rotary shaft 107 and is in mesh with the small-diameter gear part 122b. The bearing sleeve 124 to which the flywheel 103 is secured is rotatably supported on the rotary shaft 107. The bearing sleeve 124 has formed therearound a gear part 124a (number of teeth: Z15), which is in mesh with the large-diameter gear part 122a.

When the tuning knob 35 is given a sharp spin, the high-speed tuning is carried out. That is, the rotation of the shaft 104 is speeded up by Z12/Z15 times by way of the large-diameter gear part 122a and the gear part 123a, and the flywheel 103 thereby rotates at high speed, whereby a requisite rotating inertial force is imparted to the flywheel 103. Thereafter, the high speed inertial rotation of the flywheel 103 is subjected to speed reduction by Z15/Z12×Z13/Z14 times by means of the gear mechanism 121 and is transmitted to the shaft 107, whereby the pulley 111 continues to rotate. The rotation of the pulley 111 causes the indication pointer 15 to move to the terminal point of the dial reading area 33 by way of the fine cord 14, as indicated in FIG. 1.

On the one hand, when the tuning knob 35 is rotated slowly, fine-tuning is carried out. This manipulation causes the flywheel 103 to rotate, but the rotating inertial force imparted thereto is in the order of a value which does not adversely affect a fine tuning operation. Moreover, the rotation of the knob 35 is subjected to a speed reduction by Z13/Z14 times by way of the small-diameter gear part 122b and the gear 123, and the pulley 111 thus rotates at an extremely slow speed and whereby the indication pointer 15 similarly moves at an extremely slow speed.

The present invention is not limited to the above described devices 100 and 120 in which the control knob 32 and the pulley 111 are disposed at the same side of the casing 101, but other modification may be made wherein a tuning knob fitting part is provided at the opposite side as indicated by two-dot chain line in FIG. 8 and FIG. 10, and the tuning knob and the pulley 111 are respectively provided at oppsite sides of the casing 101.

Furthermore, in each embodiment set forth above, the indication pointer 15 is adopted as the indication element. The present invention is not limited to this, but other modification may be made wherein, when the tuning knob is rotated, a film bearing an indicator travels or a drum or disc bearing an indicator rotates.

Further, this invention is not limited to these embodiments but various variations and modifications may be made without departing from the scope of the invention.

What is claimed is:

1. An indication element driving device for use in a tuning apparatus having a variable capacitor for tuning, a wheel fixed to a rotary shaft of said variable capacitor, a fine cord wound around said wheel to rotate said wheel as it runs, and an indication element fixed to a part of said fine cord thereby to move together with said fine cord thus carrying out tuning indication action, said driving device comprising: a casing of a substantially cylindrical shape of which both end faces are covered; a driving shaft rotatably supported with passing through said covered end faces of said casing and adapted to be shifted in its axial direction to a first and second position selectively, and briefly rotated upon a tuning operation; a flywheel disposed coaxially with said driving shaft inside said casing and supported rotatably with respect to said driving shaft; a pulley disposed coaxially with driving shaft at an extended part thereof extending and projecting outside said casing and having said fine cord wound therearound; a first clutch which is rendered into its operating state when said driving shaft is set to the first position; a second clutch which is rendered into its operating state when said driving shaft is set to the second position; and a rotation transmission mechanism which is adapted, when said first clutch is being in its operating state, to speed up the rotation of said driving shaft and to transmit the rotation thus speeded up to said flywheel, and after the rotating manipulation to said driving shaft is released, to transmit the high-speed inertial rotation of said flywheel to said pulley, and when said second clutch is in its operating state, to subject the rotation of said driving shaft to speed reduction and then to transmit the rotation to said pulley.

2. An indication element driving device as claimed in claim 1 in which said first and second clutches respectively comprises taper-shaped friction clutches.

3. An indication element driving device as claimed in claim 1 in which each of said first and second clutches comprises a claw clutch.

4. An indication element driving device as claimed in claim 1 in which said pulley is adapted, when said first clutch is in an operating state, to rotate unitarily with said driving shaft, and when said second clutch is in an operating state, to rotate independent of said driving shaft.

5. An indication element driving device for use in a tuning apparatus having a variable capacitor for tuning, a wheel fixed to a rotary shaft of said variable capacitor, a fine cord wound around said wheel to rotate said wheel as it runs, and an indication element fixed to a part of said fine cord thereby to move together with said fine cord thus carrying out tuning indication action, said driving device comprising: a casing of a substantially cylindrical shape of which both end faces are covered; a driving shaft rotatably supported and briefly rotating upon a tuning operation, a driven shaft rotation supported, as a member independent of said driving shaft, with passing through said covered end faces of said casing; a flywheel disposed coaxially with said driven shaft inside said casing and supported rotatably with respect to said driven shaft; a pulley fixed to said driven shaft at an extended part thereof extending and projecting outside said casing and having said fine cord wound therearound; and a rotation transmission mechanism which is adapted, when said driving shaft is operated to rotate at high speeds, to speed up the high-speed rotation of said driving shaft and to transmit the rotation thus speeded up to said flywheel, and after the rotating manipulation to said driving shaft is released, to transmit the high-speed inertial rotation of said flywheel to said pulley, and, when said driving shaft is operated to rotate at low speeds, to subject the rotation of said driving shaft to speed reduction and then to transmit the rotation to said pulley.

* * * * *